United States Patent [19]
Yukawa

[11] Patent Number: 5,321,370
[45] Date of Patent: Jun. 14, 1994

[54] OPERATIONAL AMPLIFIER WITH COMMON-MODE FEEDBACK AMPLIFIER CIRCUIT

[75] Inventor: Akira Yukawa, Tokyo, Japan
[73] Assignee: NEC Corporation, Tokyo, Japan
[21] Appl. No.: 62,855
[22] Filed: May 14, 1993
[30] Foreign Application Priority Data
   May 14, 1992 [JP] Japan ................................. 4-121526
[51] Int. Cl.⁵ .............................................. H03F 3/45
[52] U.S. Cl. ..................................... 330/258; 330/253
[58] Field of Search ......................... 330/253, 257, 258
[56] References Cited
   U.S. PATENT DOCUMENTS
   4,933,644  6/1990  Fattaruso et al. ................... 330/258
   FOREIGN PATENT DOCUMENTS
   0138261  4/1985  European Pat. Off. .
   8607215  12/1986  World Int. Prop. O. .

OTHER PUBLICATIONS

"Power-Supply Rejection in Different Switched-Capacitor Filters", De La Plaza et al., IEEE Journal of Solid-State Circuits, vol. 19, Dec. 1984.
"A Family of Differential NMOS Analog Circuits for a PCM Codec Filter Chip", D. Senderowicz et al., IEEE Journal of Solid-State Circuits, SC-17, No. 6, Dec. 1982.
"High-Frequency CMOS Switched Capacitor Filters for Communication Applications", by Tat C. Choy et al., IEEE International-Solid-State Circuits Conference, Session XVII, Precision Analog Components, Feb. 1983.
"A CMOS Analog Front-end Processor for an FDM System", K. R., Lakshmikumar et al., Proceedings of the IEEE 1990 Custom Integrated Circuits Conference, May 1990, Boston, US.

Primary Examiner—James B. Mullins

[57] ABSTRACT

An operational amplifier circuit is formed by an operational amplifier stage having a balanced output function and a common-mode feedback amplifier stage. The common-mode feedback amplifier stage includes a first transistor pair which receives a reference voltage at their gates, a second transistor pair having gates connected respectively to a positive and a negative output of the operational amplifier stage, a transistor which receives at its gate an expected operating center voltage, and a current-mirror circuit for feeding-back an output feedback signal to the operational amplifier stage through a feedback path. The common-mode feedback amplifier stage of this invention makes it possible to stabilize the output voltages of the operational amplifier circuit and to enhance or widen an output dynamic range, without an addition of feedback circuit elements which are connected in series to the feedback path and in which voltage drop develops.

5 Claims, 3 Drawing Sheets

OPERATIONAL AMPLIFIER WITH COMMON-MODE FEEDBACK AMPLIFIER CIRCUIT

BACKGROUND OF THE INVENTION (1) Field of the Invention

The present invention relates to an operational amplifier, and more particularly to a balanced type operational amplifier.

(2) Description of the Related Art

In a conventional operational amplifier to which the present invention relates, there have been known some circuits for stabilizing an output operation point.

A first example of such circuits is shown in FIG. 1. The circuit is disclosed in IEEE, ISSCC, 1983, pages 246, 247 and 314, entitled "High-Frequency CMOS Switched Capacitor Filters for Communication Applications" by Tat C. Choi et al. In summary, in a single-stage folded cascade type operational amplifier, an N-channel transistor pair 101 which has gates connected to a positive and a negative output terminal of the amplifier, respectively, and which operates in triode region is connected between a constant-current load 102 and a power supply source VS in series. In this operational amplifier, when the common-mode output voltage becomes high, the triode region device of the N-channel transistor pair 101 functions to decrease its resistance value so that negative feedback effect is applied to the operational amplifier thereby lowering the common-mode output voltage.

A second example of such circuits is shown in FIGS. 2A and 2B. The circuit is disclosed in IEEE, JOURNAL OF SOLID-STATE CIRCUITS, Vol. SC-17, No. 6, December 1982, pages 1014–1023, entitled "A Family of Differential NMOS Analog Circuits for a PCM Codec Filter Chip" by Daniel Senderowics et al. In summary, as shown in FIG. 2A, switches driven by clock signals externally applied in combination with the capacitors C1 produce a feedback voltage by adding to a reference voltage R a difference between an average voltage of the actual positive/negative outputs OP, ON from the operational amplifier 201 and an operation point voltage C expected in the same operational amplifier 201 and, then, the feedback voltage thus produced is negatively fedback to the operational amplifier 201 through a feedback path F. FIG. 2B shows a detailed circuit diagram of the operational amplifier 201 in which two differential amplifiers, namely, M1, M2 and M7, M8, with their respective active loads M3, M4 and M9, M10 are provided. The current-source transistor M5 is driven to obtain a local common-mode feedback for the first stage differential amplifier (M1, M2). The above mentioned feedback voltage is applied to a gate of the current-source transistor M6 through the feedback path F so that the operating current of this transistor M6 is controlled to be increased or decreased, thereby stabilizing the output voltage of the operational amplifier 201.

A third example of such circuits is shown in FIG. 3. The circuit is disclosed in IEEE, JOURNAL OF SOLID-STATE CIRCUITS, Vol. SC-19, No. 6, December 1984, pages 912–918, entitled "Power-Supply Rejection in Differential Switched-Capacitor Filters" by Alejandro Dela Plaza et al. In summary, as shown in FIG. 3, the circuit is based on the utilization of the effect that the operating center voltage VC of the operational amplifier can be derived as a voltage developed at an intermediate node between resistors R3 having the same resistance value, connected in series between the positive and negative output terminals of the operational amplifier. The operating center voltage VC is inputted to one input terminal of a differential amplifier 31 and the operating voltage C inherently expected in the operational amplifier is inputted to the other input terminal thereof. The feedback signal FB thus obtained is negatively fedback to the operational amplifier such as shown in FIG. 2B through the feedback path F.

The above conventional circuits for stabilizing the output voltage of the operational amplifier have the following drawbacks.

In the first example of circuit shown in FIG. 1, since the comparison between the actual center voltage of the positive/negative outputs of the operational amplifier and the expected operating center voltage therefor is not conducted precisely, the above actual center voltage does not necessarily correspond to the above expected voltage due to such variations as those in the reference voltages or in the characteristics of the transistors concerned where the circuit is integrated, even though it satisfies the operation range or margin of the amplifier.

In the second example of circuit shown in FIGS. 2A and 2B, since the circuit employs the switching circuits driven by the clock signals, the circuit necessarily requires the provision of a filter for eliminating the feed-through noise that may be caused by the clock signals when the positions of the switching circuits are changed to the side of the feedback path and to the side of the reference voltage source. This is a drawback in the second example of circuit.

In the third example of circuit shown in FIG. 3, since the two resistors R3 from which the operating center voltage of the operational amplifier is derived at their common connection node stand as loads for the operational amplifier, the gain of the operational amplifier is distinctly lowered where the resistance value of the resistors is small. For this reason, the circuit of this third example has a defect in that it necessitates either the high transconductance of the output-stage transistors accompanying an increase of the necessary chip area and a large power consumption or the high resistance value of the resistors accompanying an increase of the necessary chip area and a degradation of the common-mode rejection ration caused by the variations in the resistance value.

SUMMARY OF THE INVENTION

It is, therefore, an object of the present invention to overcome the drawbacks existing in the conventional operational amplifiers, and to provide an improved operational amplifier with a common-mode feedback amplifier circuit.

According to one aspect of the invention, there is provided an operational amplifier circuit having an operational amplifier stage for outputting a positive and a negative output voltage at a positive and a negative output terminal, respectively, and a common-mode feedback amplifier stage for feeding-back an output feedback signal to the operational amplifier stage, the common-mode feedback amplifier stage comprising:

a first and a second power supply source;

a first transistor pair which is formed by a first and a second transistor of a first conductivity type, and in which gates are connected together and further connected to a reference voltage source;

a second transistor pair which is formed by a third and a fourth transistor of the first conductivity type, and in which sources are connected together and further connected to the second power supply source, drains are connected together and further connected to a source of the first transistor, and gates are connected to the positive and negative output terminals of the operational amplifier stage, respectively;

a fifth transistor of the first conductivity type, having a gate receiving an expected operating center voltage for the output voltages of the operational amplifier stage, a drain connected to a source of the second transistor, and a source connected to the second power supply source; and a current-mirror circuit which is formed by a sixth and a seventh transistor of a second conductivity type, and in which sources are connected together and further connected to the first power supply source, drains are connected to drains of the first and second transistors, respectively, and gates are connected together and further connected to the drain of the first transistor, the output feedback signal being outputted from the drain of the seventh transistor and fed-back to the operational amplifier stage.

BRIEF DESCRIPTION OF THE DRAWINGS

The above and other objects, features and advantages of the present invention will be apparent from the following description of a preferred embodiment of the invention explained with reference to the accompanying drawings, in which.

PREFERRED EMBODIMENT OF THE INVENTION

Now, a preferred embodiment of the present invention is explained with reference to the accompanying drawings.

Figure 1:
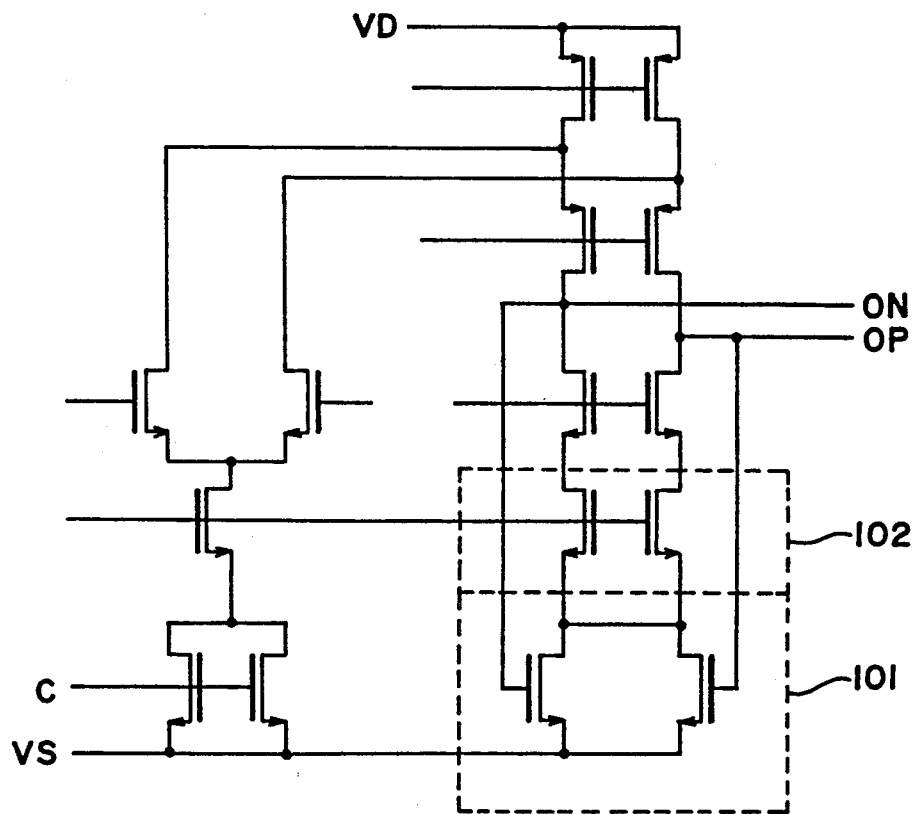
FIG. 1 is a circuit diagram showing a first example of a conventional operational amplifier circuit.
Figure 2A:
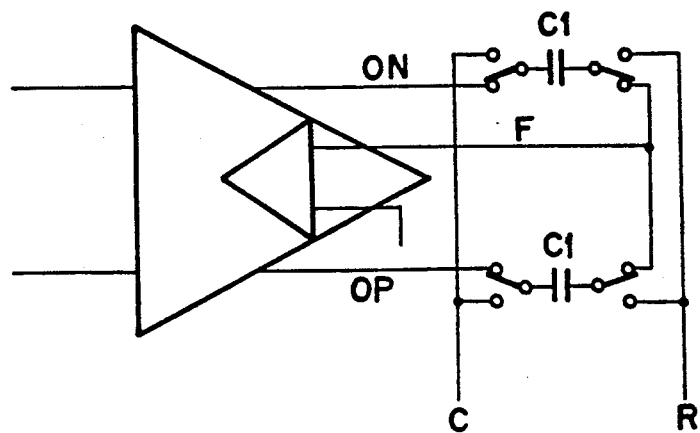
FIGS. 2A and 2B are circuit diagrams showing a second example of a conventional operational amplifier circuit.
Figure 2B:
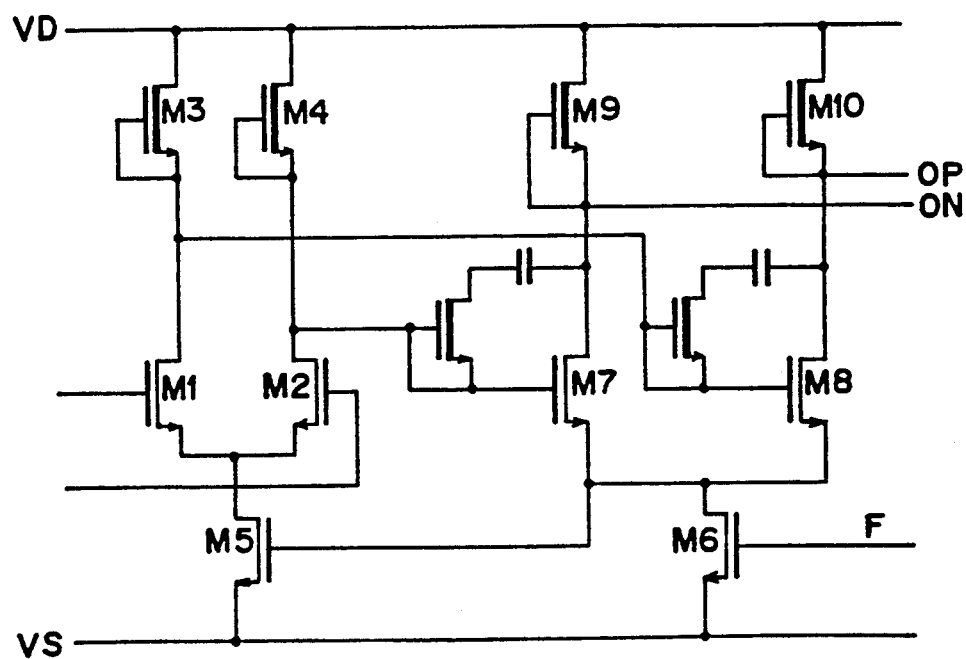
Figure 3:
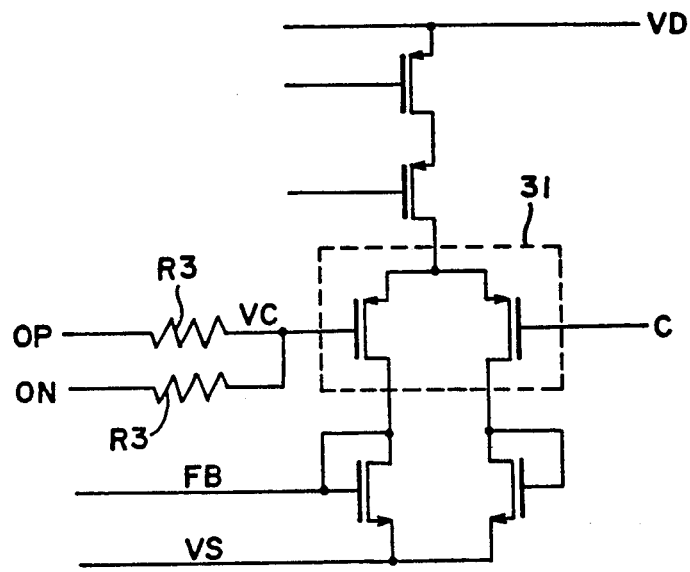
FIG. 3 is a circuit diagram showing a third example of a conventional operational amplifier circuit.
Figure 4:
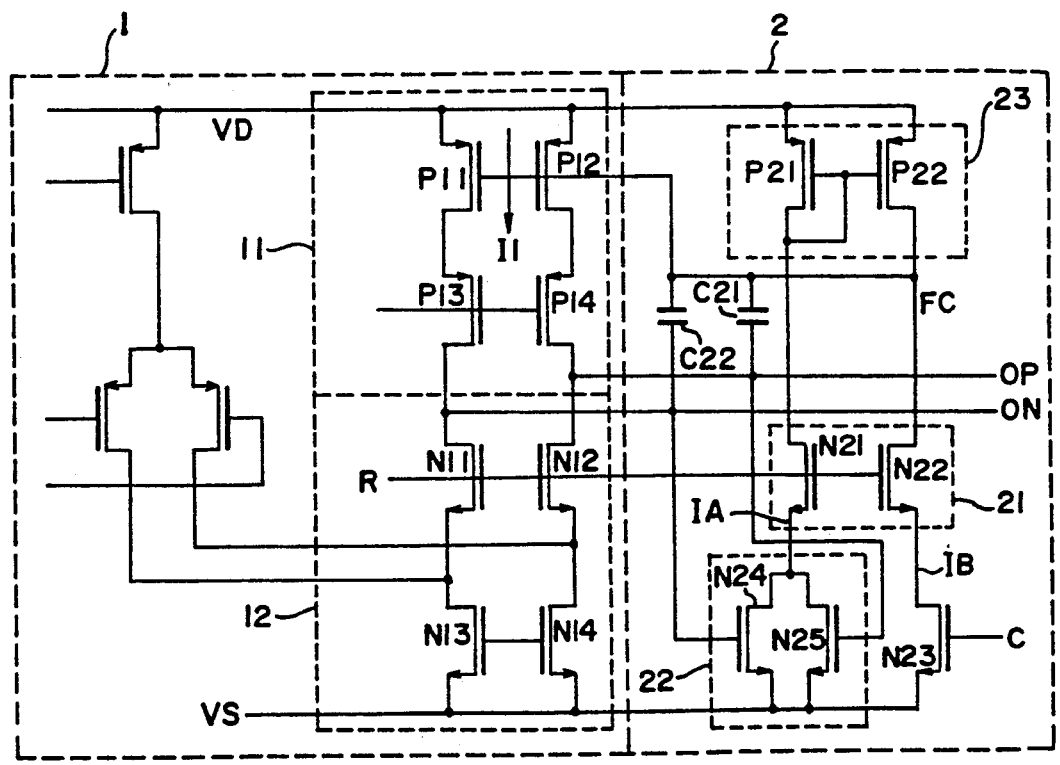
FIG. 4 is a circuit diagram showing an operational amplifier circuit of an embodiment according to the invention.

FIG. 4 is a ditailed circuit diagram of an operational amplifier circuit equipped with a common-mode feedback amplifier circuit according to the invention.

As shown in FIG. 4, the operational amplifier circuit of the invention is formed by an operational amplifier stage 1 having a balanced output function, and a common-mode feedback circuit stage 2 for producing a common-mode feedback signal FC for the operational amplifier stage 1.

The operational amplifier stage 1 comprises a positive output circuit 11 which is formed by cascade connected P-channel transistors P11, P13 and P12, P14, and a negative output circuit 12 which is formed by cascade connected N-channel transistors N11, N13 and N12, N14.

The common-mode feedback circuit stage 2 comprises: a transistor pair 21 formed by N-channel transistors N21 and N22 having gates connected together and further connected to a reference voltage source R; a transistor pair 22 formed by N-channel transistors N24 and N25 having sources connected together and further connected to a power supply source VS, drains connected together and further connected to a source of the transistor N21, and gates connected to a positive output terminal OP and a negative output terminal ON of the operational amplifier stage 1, respectively; an N-channel transistor N23 having a gate receiving an operating center voltage C for setting a center value of the output voltages of the operational amplifier stage 1, a drain connected to a source of the transistor N22, and a source connected to the power supply source VS; and a current-mirror circuit 23 formed by P-channel transistors P21 and P22 having sources connected together and further connected to a power supply source VD, drains connected to the drains of the transistors N21 and N22, respectively, and gates connected together and further connected to the drain of the transistor N21. The current-mirror circuit 23 operates to feedback an output feedback signal FC derived from the drain of the transistor P22 to the operational amplifier stage 1.

The common-mode feedback circuit stage further comprises a capacitor C21 connected between the drain of the transistor P22 and the positive output terminal OP and a capacitor C22 connected between the drain of the transistor P22 and the negative output terminal ON, each of the capacitors C21 and C22 being for feed-forwading compensation for high frequency components.

Hereunder, the operation of the above operational amplifier circuit of the invention is explained.

The embodiment shown in the drawings is one which is applied to an operational amplifier circuit of a single-stage folded cascade type. In this circuit, the reference voltage R for the operational amplifier stage 1 is commonly applied to the gates of the transistor pair 21 in the common-mode feedback circuit stage 2. In this circuit, the transistor pair 22 and the transistor N23 which has a size equal to a sum of sizes of the transistors N24 and N25 constituting the transistor pair 22, respectively, operate in the triode region. The operation in this triode region is determined by the reference voltage R applied to the gates of the N-channel transistors N21 and N22 constituting the transistor pair 21. The drain voltages of the transistor N23 and the transistors N24, 25 are slightly lower than the reference voltage R by the threshold voltages VT of the transistors N21 and N22. If the above drain voltage is lower than the voltage which is obtained by subtracting the transistor concerned from the lower one of the voltages applied to the gates of the transistor pair 22, the above mentioned operation in the triode region is ensured.

Now, it is assumed that the total current IA flowing in the transistor pair 22 is identical with the current IB flowing in the transistor N23. In this state, the center voltage VC of the outputs from the operational amplifier stage 1 becomes equal to the expected operating center voltage C. These currents IA and IB are terminated by the transistors P21 and P22, respectively, of the current-mirror circuit 23 through the transistors N21 and N22 constituting the transistor pair 21. If the currents IA and IB flowing in the current-mirror circuit 23 are identical with each other, the drain voltages of the transistors P21 and P22 become identical with each other, resulting in a state wherein there is a flow of a current I1 which is determined by the above drain voltages and also the characteristics of the P-channel transistors P11~P14 of the positive output circuit 11 in the operational amplifier stage 1.

Next, it is assumed that the actual center voltage VC becomes higher than the expected operating center voltage C. In this case, the current IA flowing in the transistor pair 22 becomes greater than the current IB flowing in the transistor N23. The variations in the currents cause the output voltage of the current-mirror circuit 23, that is, the drain voltage of the transistor P22 to be raised. In response to this, the current I1 flowing in the transistors P11~P14 of the positive output circuit 11 in the operational amplifier stage 1 decreases, so that the positive and negative output voltages are lowered so as to keep the balanced state. Contrary to the above, when the center voltage VC becomes lower than the expected operating center voltage C, the current I1 is caused to be raised, so that the balanced state is kept also. The capacitors C21 and C22 are for applying feed-forward compensation to the feedback path in the case where the frequency bandwidth of the negative feedback circuit is not wide enough. Where the operational amplifier stage 1 itself has a narrow frequency bandwidth, the frequency compensation capacitors C21 and C22 are not required to the circuit.

Though a preferred embodiment has been explained by making reference to the drawings, it is to be noted that various modifications can be made without limitative to the above embodiment. For example, the present invention can be also applied to the circuit configuration in which the conductivity types of N- and P-type of the respective transistors in the embodiment shown are changed and further the polarities of the power supply sources are changed.

Further, it is needless to say that the present invention can be applied to a two-stage folded cascade type operational amplifier circuit which has a push and pull output circuit, in place of the single-stage folded cascade type explained above.

As explained hereinabove, the operational amplifier circuit according to the present invention comprises a common-mode feedback amplifier circuit formed by a first transistor pair, a second trnasistor pair having gates connected respectively to a positive and a negative output of the operational amplifier stage, a third transistor which receives at its gate an expected operating center voltage, and a current-mirror circuit for feeding-back an output feedback signal to the operational amplifier stage. The common-mode feedback amplifier circuit of this invention makes it possible to enhance or widen an output dynamic range, without an addition of feedback circuit elements which are connected in series to the feedback path and in which voltage drop develops.

As the operational amplifier circuit of this invention does not employ any switching circuit, it does not require any filter for eliminating or suppressing the feed-through noise that may be caused by the operation of the switching circuit.

Further, as the operational amplifier circuit of this invention does not require a resistor network which stands as a load for the operational amplifier circuit and which requires a large chip area occupied, it is possible to prevent the lowering of the gain and to make the overall operational amplifier circuit compact.

While the invention has been described in its preferred embodiment, it is to be understood that the words which have been used are words of description rather than limitation and that changes within the purview of the appended claims may be made without departing from the true scope and spirit of the invention in its broader aspects.

What is claimed is:

1. An operational amplifier circuit having an operational amplifier stage for outputting a positive and a negative output voltage at a positive and a negative output terminal, respectively, and a common-mode feedback amplifier stage for feeding-back an output feedback signal to said operational amplifier stage, said common-mode feedback amplifier stage comprising:

a first and a second power supply source;

a first transistor pair which is formed by a first and a second transistor of a first conductivity type, and in which gates are connected together and further connected to a reference voltage source;

a second transistor pair which is formed by a third and a fourth transistor of the first conductivity type, in which sources are connected together and further connected to said second power supply source, drains are connected together and further connected to a source of said first transistor, and gates are connected to said positive and negative output terminals of said operational amplifier stage, respectively;

a fifth transistor of the first conductivity type, having a gate receiving an expected operating center voltage for the output voltages of the operational amplifier stage, a drain connected to a source of said second transistor, and a source connected to said second power supply source; and a current-mirror circuit which is formed by a sixth and a seventh transistor of a second conductivity type, and in which sources are connected together and further connected to said first power supply source, drains are connected to drains of said first and second transistors, respectively, and gates are connected together and further connected to the drain of said first transistor, said output feedback signal being outputted from the drain of said seventh transistor and fed-back to said operational amplifier stage.

2. An operational amplifier circuit according to claim 1, in which said common-mode feedback amplifier stage further comprising a first and a second capacitor for feed-forward compensation at high frequency components, said first capacitor being connected between the drain of said seventh transistor and the positive output terminal of the operational amplifier stage and said second capacitor being connected between the drain of said seventh transistor and the negative output terminal of said operational amplifier stage.

3. An operational amplifier circuit according to claim 1, in which said fifth transistor has a size equal to a sum of sizes of said third and fourth transistors constituting said second transistor pair, said fifth transistor and said second transistor pair operating in a triode region.

4. An operational amplifier circuit according to claim 1, in which said reference voltage applied to the gates of said first transistor pair is commonly used as a reference voltage for said operational amplifier stage.

5. An operational amplifier circuit according to claim 1, in which said first and second conductivity types are an N-channel type and a P-channel type, respectively.

* * * * *